(12) United States Patent
Cheng et al.

(10) Patent No.: US 10,962,614 B2
(45) Date of Patent: Mar. 30, 2021

(54) STATE SPACE CONTROLLER AND GRADIENT POWER AMPLIFIER

(71) Applicant: Shanghai Neusoft Medical Technology Co., Ltd., Shanghai (CN)

(72) Inventors: Gong Cheng, Shenyang (CN); Qin Xu, Shenyang (CN)

(73) Assignee: Shanghai Neusoft Medical Technology Co., Ltd., Shanghai (CN)

(*) Notice: Subject to any disclaimer, the term of this patent is extended or adjusted under 35 U.S.C. 154(b) by 44 days.

(21) Appl. No.: 16/031,881

(22) Filed: Jul. 10, 2018

(65) Prior Publication Data

US 2019/0018093 A1    Jan. 17, 2019

(30) Foreign Application Priority Data

Jul. 11, 2017  (CN) .......................... 201710561177.2

(51) Int. Cl.
*G01R 33/385*    (2006.01)
*G01R 33/36*    (2006.01)

(52) U.S. Cl.
CPC ..... *G01R 33/3852* (2013.01); *G01R 33/3607* (2013.01); *H03F 2200/261* (2013.01)

(58) Field of Classification Search
CPC ............ G01R 33/3852; G01R 33/3607; G01R 33/385; H03F 2200/261
See application file for complete search history.

(56) References Cited

U.S. PATENT DOCUMENTS

| 9,897,672 B2 * | 2/2018 | Smits ................. | G01R 33/3852 |
| 2013/0285664 A1 * | 10/2013 | Scheel ............... | G01R 33/3852 324/319 |
| 2015/0177345 A1 * | 6/2015 | Ham .................. | G01R 33/3852 324/309 |
| 2017/0212194 A1 * | 7/2017 | Zhang ............... | G01R 33/3852 |

FOREIGN PATENT DOCUMENTS

CN        103261907 B    2/2016

* cited by examiner

*Primary Examiner* — Dominic E Hawkins
(74) *Attorney, Agent, or Firm* — McCoy Russell LLP

(57) ABSTRACT

A state space controller includes an integral part configured to integrate a control deviation, wherein the control deviation indicates a difference between a digital value of a gradient coil current and a reference current; a delay compensator configured to generate a digital control amount according to the integrated control deviation by the integral part, and generated a pulse-width modulation drive signal according to the digital control amount, and includes a subtractor of which a non-inverting input terminal is connected to an output terminal of the integral part, a delayer configured to delay the digital control amount by one calculation cycle, and a first feedback loop configured to delay the digital control amount by one calculation cycle and multiply a first compensation coefficient to obtain a first compensation amount, wherein the first compensation amount is input into a first inverting input terminal of the subtractor.

7 Claims, 5 Drawing Sheets

STATE SPACE CONTROLLER AND GRADIENT POWER AMPLIFIER

CROSS REFERENCE TO RELATED APPLICATIONS

This application claims priority to Chinese Patent Application No. 201710561177.2, entitled "STATE SPACE CONTROLLER AND GRADIENT POWER AMPLIFIER," filed on Jul. 11, 2017, the entire content of which is incorporated herein by reference.

BACKGROUND

The principle of MRI (Magnetic Resonance Imaging) is that a subject placed in a magnetic field can be excited by radio frequency electromagnetic waves to generate magnetic resonance signals. Magnetic resonance signals can be acquired by a receiver coil. Processing the magnetic resonance signals according to a certain mathematical method can create a digital image. Among them, the subject placed in the magnetic field contains nuclei whose spins are not zero. When a MRI scan is performed on a human body, electromagnetic signals are obtained from the human body using a magnetic resonance phenomenon, and human body information can be obtained. In order to spatially encode the received magnetic resonance signals and determine the slice or slice thickness of the MRI scan, the gradient magnetic fields are added to the main magnetic field of the MRI system. The gradient magnetic fields have gradients in the orthogonal x-, y-, and z-directions.

Gradient power amplifiers excite gradient coils to generate gradient currents to obtain gradient magnetic fields. Accurate control of the gradient current is required to produce a gradient magnetic field that meets imaging requirements. A built-in closed-loop controller of the gradient power amplifier is responsible for accurately controlling the gradient coil current. Current technologies used by the controller include PID (Proportional-Integral-Derivative) control technology and state space control technology. Controllers that use state space control technology can be called state space controllers. The state space controller may generate a Pulse-Width Modulation (PWM) driver signal, and control the output voltage of the gradient power amplifier through this signal, thereby controlling the current of the gradient coil which is a load of the gradient power amplifier.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, MRI, digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

DETAILED DESCRIPTION

Figure 1:
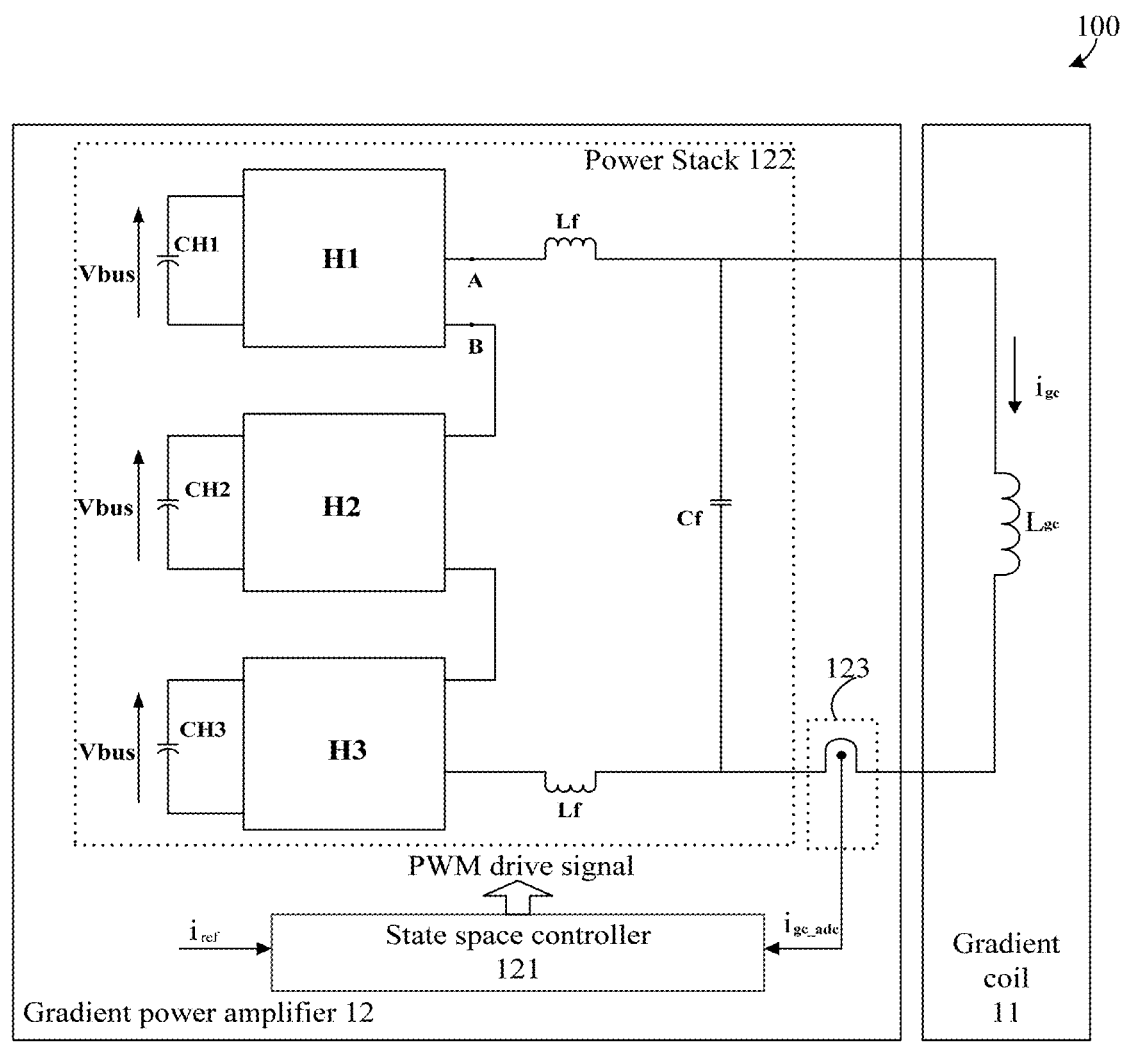
FIG. 1 is a schematic diagram illustrating a principle of generating a gradient magnetic field according to an example of the present disclosure.

In a magnetic resonance imaging (MRI) system, gradient magnetic fields can be added in a main magnetic field to obtain spatial encoding of received magnetic resonance signals. And the gradient magnetic fields are obtained by a gradient power amplifier excitation of a gradient coil to generate gradient currents. FIG. 1 illustrates a principle of generating a gradient magnetic field. An MRI system 100 is shown in FIG. 1. As shown in FIG. 1, the gradient coil 11 is a load of the gradient power amplifier 12. The gradient coil 11 and the gradient power amplifier 12 are included in the MRI system 100, in the illustrated example. The gradient power amplifier 12 may include a state space controller 121, a power stack 122, and a data acquisition section 123. Among them, the state space controller 121 can receive an output current sampled by the data acquisition section 123, and the output current is generated by the power stack 122. This output current is also the current $i_{gc}$ send to the gradient coil 11. Because the state space controller 121 operates in the digital domain, the data acquisition section 123 needs to perform analog-to-digital conversion for the sampled gradient coil current $i_{gc}$ which is generated by the power stack 122, and then send the digital value of the gradient coil current $i_{gc\_adc}$ to the state space controller 121.

The state space controller 121 may generate a Pulse-Width Modulation (PWM) drive signal through a state space control algorithm based on the received digital value of the gradient coil current $i_{gc\_adc}$ and a reference current $i_{ref}$. This PWM drive signal may in turn input into the power stack 122 to adjust the above-described output current $i_{gc}$, and obtain the above-mentioned $i_{gc\_adc}$ via the data acquisition section 123. In this way, a closed-loop feedback is formed so that the current output from the gradient power amplifier 12 to the gradient coil 11 can be as close as possible to the reference current $i_{ref}$.

From the above, it can be seen that the state space controller 121 is actually a core component that realizes relative accurate control of the output current $i_{gc}$ of the gradient power amplifier 12. A general structure of the current state space controller is relatively complex, and a control algorithm involves many parameters, which is not only costly, but also affects the control efficiency. The present disclosure provides a new state space controller with a simple structure and relatively simple implementation of a control algorithm, which will be described in detail as follows.

Figure 2:
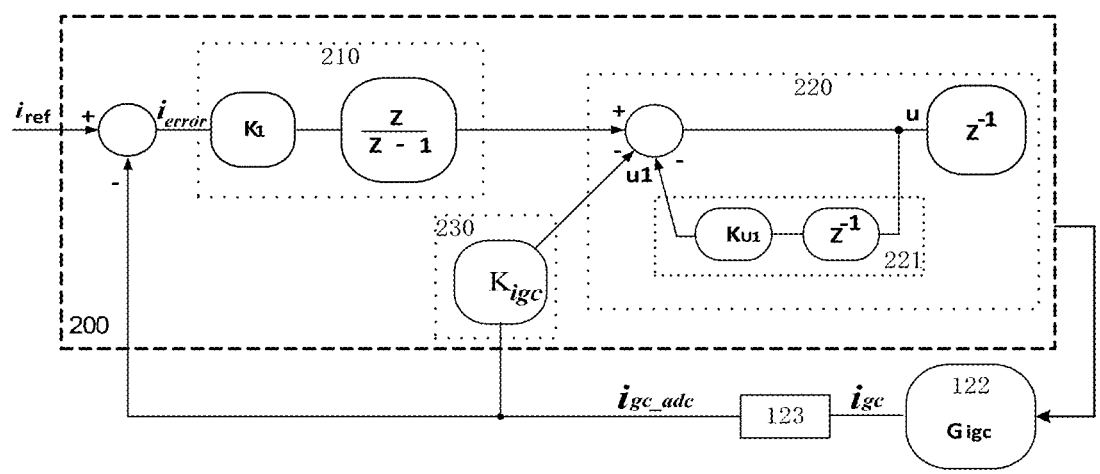
FIG. 2 is a schematic diagram illustrating a structure of a state space controller according to an example of the present disclosure.

FIG. 2 illustrates a structure of a state space controller of the present disclosure. As shown in FIG. 2, the state space controller 200 may include an integral part 210 and a delay compensator 220. The gradient coil current $i_{gc}$ generated by the gradient power amplifier 12 (specifically, the power stack 122 therein) is converted to a digital value $i_{gc\_adc}$ and fed back to the state space controller 200 through the data acquisition section 123. Wherein, $G_{igc}$ represented in the power stack 122 in FIG. 2 is a transfer function from a digital control amount u generated by the controller to the gradient coil current $i_{gc}$. The transfer function reflects a mathematical relationship of intrinsic physical laws among the digital control amount u and the gradient coil current $i_{gc}$. This is determined by the topology of the power stack 122 in the gradient power amplifier 12, and does not depend on the state space controller 200. After the state space controller 200 receives the digital value of the gradient coil current $i_{gc\_adc}$ via the data acquisition section 123, a state space control processing flow shown in FIG. 3 may be executed, as follows.

At step 301, a control deviation is calculated based on a difference between the digital value of the gradient coil current and a reference current.

For example, as shown in FIG. 2, the gradient coil current $i_{gc}$ is performed an analog-to-digital conversion to obtain the digital value $i_{gc\_adc}$, and the state space controller 200 subtracts the digital value of the gradient coil current $i_{gc\_adc}$ from the reference current $i_{ref}$ to get the control deviation $i_{error}$.

At step 302, integration is performed based on the control deviation.

For example, the integral part 210 in FIG. 2 may be used to multiply the control deviation $i_{error}$ by an integral coefficient $K_1$, and then integrate the result by an integral operation unit $z/(z-1)$.

In one example, as shown in FIG. 2, the integrated control deviation may be sent to the non-inverting input terminal of a subtractor of a delay compensator 220.

At step 303, a compensation amount corresponding to the digital value of the gradient coil current $i_{gc\_adc}$ is subtracted from the integrated control deviation to get an initial control amount, and passed to the delay compensator 220.

In one example, as shown in FIG. 2, a third feedback loop 230 may multiply the digital value of the gradient coil current $i_{gc\_adc}$ by a third compensation coefficient $K_{igc}$ to obtain a third compensation amount, and a third inverting input terminal of the subtractor receives the third compensation amount. The third compensation amount is subtracted from the integrated control deviation obtained in step 302 to get an initial control amount, and then passed it to the delay compensator 220.

At step 304, the digital control amount u is generated by the delay compensator 220 according to the initial control amount.

For example, after receiving the initial control amount obtained in step 303, the digital control amount u is calculated by the delay compensator 220 in FIG. 2. The delay compensator 220 may include at least one feedback loop. The feedback loop is used to delay the digital control amount u by at least one calculation cycle and multiplying by a corresponding coefficient to obtain a compensation amount. The compensation amount is subtracted from the digital control amount u.

In one example, as shown in FIG. 2, the delay compensator 220 may include a first feedback loop 221. The first feedback loop 221 delays the digital control amount u by one calculation cycle to obtain a first delayed digital control amount, and multiplies the first delayed digital control amount by a corresponding first compensation coefficient $K_{u1}$ to obtain a first compensation amount u1. The first compensation amount u1 is sent to a first inverting input terminal of the subtractor. The subtractor of the delay compensator 220 subtracts the u1 from the initial control amount, getting the digital control amount u.

Figure 4:
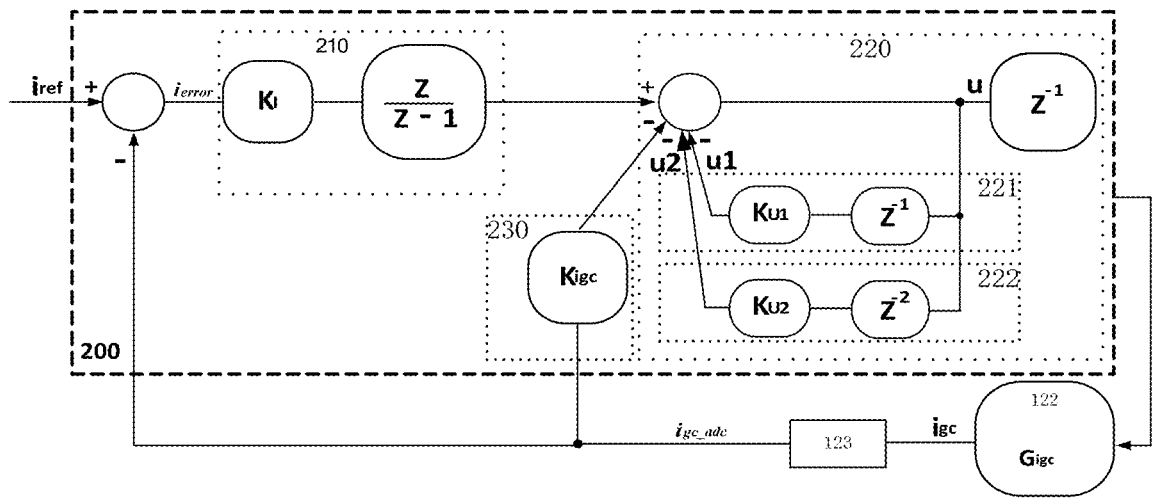
FIG. 4 is a schematic diagram illustrating another structure of a state space controller according to an example of the present disclosure.

In another example, as shown in FIG. 4, the delay compensator 220 may include a second feedback loop 222 besides the first feedback loop 221. The second feedback loop 222 delays the control amount u by two calculation cycles to obtain a second delayed digital control amount, multiplies the second delayed digital control amount by a corresponding second compensation coefficient $K_{u2}$ to obtain a second compensation amount u2. The second compensation amount u2 is sent to a second inverting input terminal of the subtractor. The subtractor of the delay compensator 220 subtracts the u2 in addition to the u1 to obtain the digital control amount u.

Exemplarily, the delay compensator 220 of the present disclosure may include only the first feedback loop 221 as shown in FIG. 2, or only include the first feedback loop 221 and the second feedback loop 222 as shown in FIG. 4. The delay compensator of the present disclosure includes only one or two feedback loops and needs to compensate one delay cycle, or one and two delay cycles. This avoids multiple delay compensation cycles and makes the delay compensator more compact.

At step 305, the digital control amount is delayed by one calculation cycle.

For example, as shown in FIG. 2, the digital control amount u obtained in step 304 is delayed by one calculation cycle in a delayer.

At step 306, a PWM drive signal for controlling the power stack is generated based on the delayed digital control amount.

For example, the delayed digital control amount can be compared with a triangular wave carrier. When the delayed digital control amount is higher than a voltage value of the triangular wave carrier, the PWM drive signal may be set to a high level voltage. When the delayed digital control amount is lower than a voltage value of the triangular wave carrier, the PWM drive signal may be set to a low level voltage.

Figure 3:
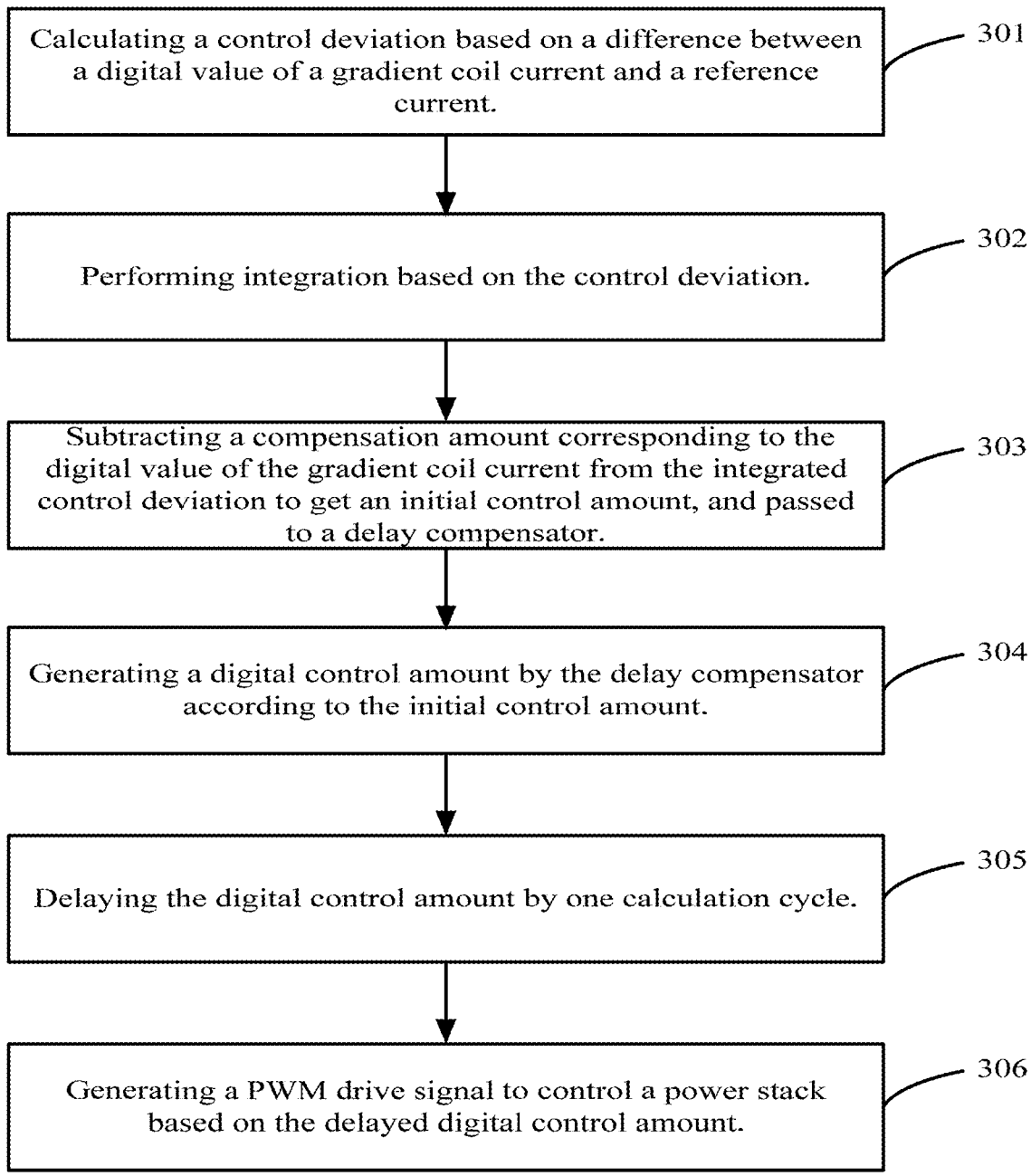
FIG. 3 is a schematic diagram illustrating a processing flow of a state space control method according to an example of the present disclosure.

The PWM drive signal generated by the state space controller shown in FIG. 3 indicates that the controller only processes the digital value of the gradient coil current $i_{gc\_adc}$. And the delay compensator in the controller can delay the digital control amount u by one calculation cycle, or delay one and two calculation cycles. The controller in this way has a relative simple structure, requires fewer calculation parameters, and has a simple control algorithm, thereby realizing a simple and rapid state space controller.

The PWM drive signal output by the state space controller can be used to drive the power stack of the gradient power amplifier to generate the desired gradient coil current $i_{gc}$. This process is briefly described below with reference to FIG. 1. As shown in FIG. 1, the power stack 122 may include full-bridge inverter units and a gradient filter connected to the full-bridge inverter units. For example, FIG. 1 includes three full-bridge inverter units H1, H2, and H3, and the gradient filter composed of two filter inductors Lf and one filter capacitor Cf. For the full-bridge inverter unit H1, an input voltage is Vbus, and an output voltage is the voltage between point A and point B.

Figure 5:
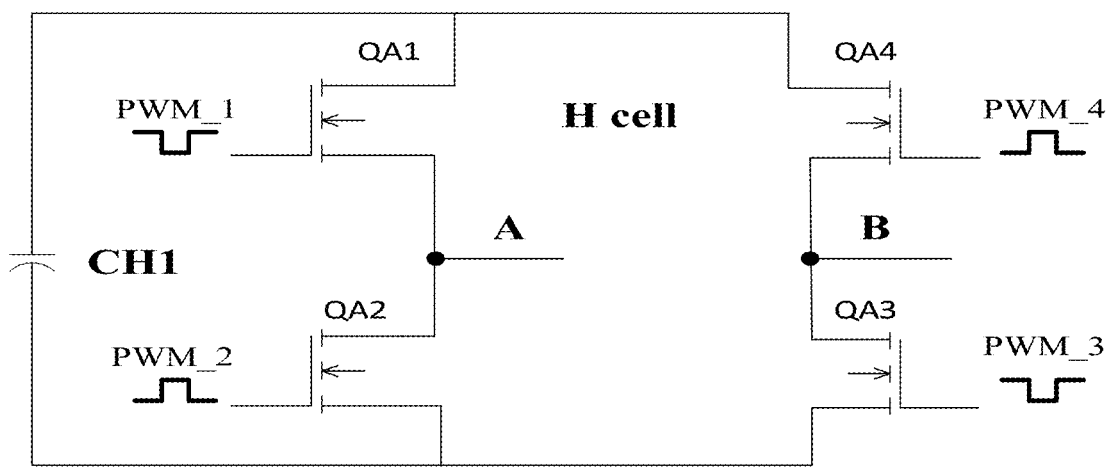
FIG. 5 is a schematic diagram illustrating a structure of a full-bridge inverter unit according to an example of the present disclosure.

A principle of each full bridge inverter unit can be seen in FIG. 5. The full-bridge inverter unit is a key component that converts a DC voltage to an AC voltage. Each full-bridge inverter unit is composed of two bridge arms. Each bridge arm is composed of two active switching elements (such as QA1 and QA2) and is divided into a high side driver (such as QA1) and a low side driver (such as QA2). When the high side and low side drivers alternately work, an adjustable voltage can be generated at midpoints of the bridge arms (such as points A and B). An output voltage of the full-bridge inverter unit is an algebraic difference between the two midpoint voltages of the bridge arms. The on-off states of the active switching elements are determined by the PWM drive signal. By controlling a duty cycle of the PWM drive signal, the midpoint voltages of the bridge arms can be adjusted. The PWM drive signal turns on and off the active switch elements in the full-bridge inverter unit, thereby, makes the full-bridge inverter unit working. Connect the output voltages of the three inverter units in serial, and then filter by the gradient filter. Output this filtered voltage to the gradient coil $L_{gc}$ to generate the gradient current $i_{gc}$.

Figure 6:
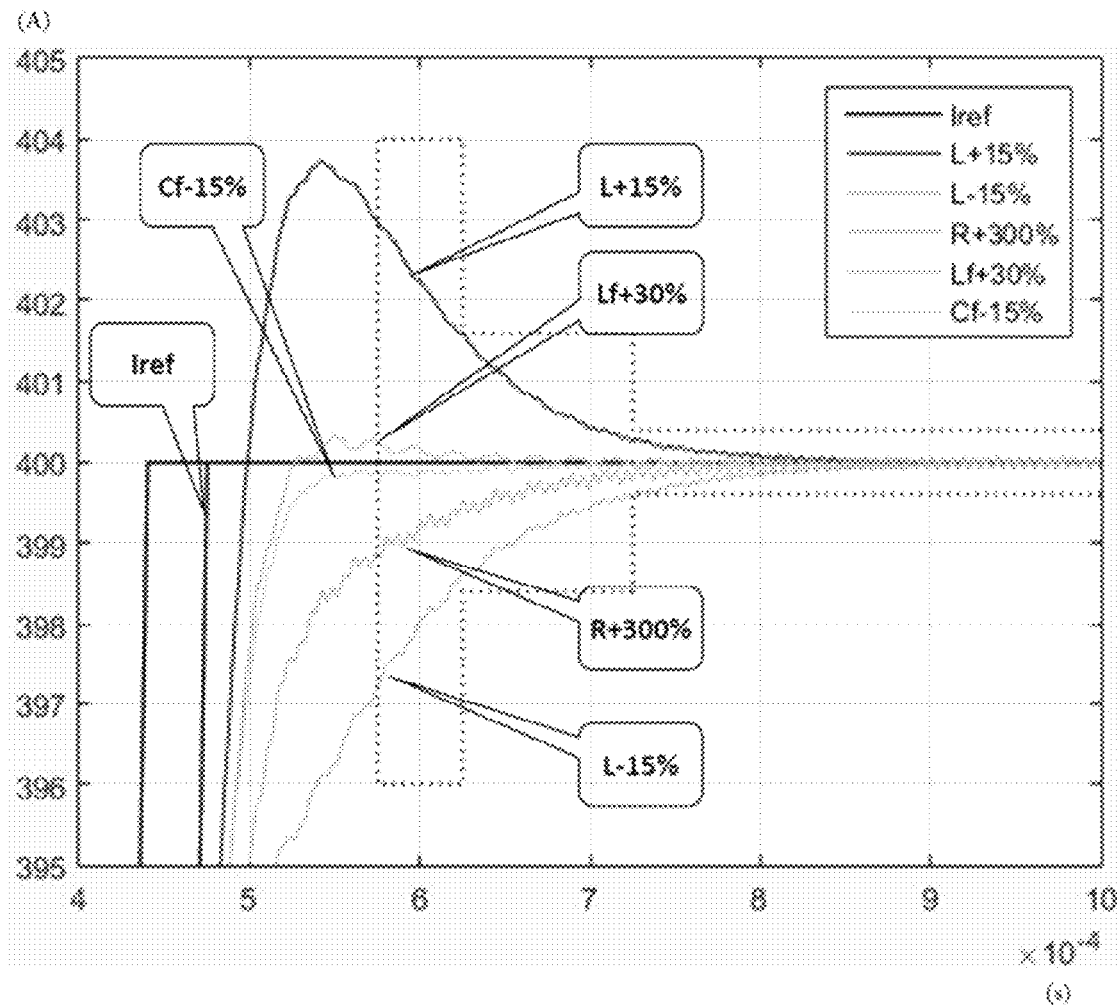
FIG. 6 is a schematic diagram illustrating a controller performance simulation result according to an example of the present disclosure.

In the gradient power amplifier of the present disclosure, the PWM drive signal can be generated through the built-in state space controller, and drive the power stack to generate the desired gradient coil current. The data acquisition section samples and digitalizes the gradient coil current $i_{gc}$ to obtain the digital value of the gradient coil current $i_{gc\_adc}$. The controller receives $i_{gc\_adc}$, and the difference between the $i_{gc\_adc}$ and the reference current $i_{ref}$ is calculated by the integral part and the delay compensator, and the PWM drive signal is generated again. The gradient current $i_{gc}$ output from the gradient power amplifier is adjusted in this way, such that the difference between the $i_{gc}$ and the $i_{ref}$ approaches zero. Moreover, the structure of the state space controller in this method is relatively compact and calculations are relatively simple, and it also has an advantage of good robustness of state space controllers. As shown in FIG. 6, simulation results show that the disclosed state space controller with better robustness. The dashed box in FIG. 6 is a specification of an output current control range to be achieved by the controller. When the values of a gradient coil inductor L, a gradient coil resistor R, a gradient power amplifier filter inductor Lf, and a gradient power amplifier filter capacitor Cf change shown in the upper right corner of FIG. 6, the output current curves do not exceed the dash box, which indicates that the control of the output current meets the specification. Where R is not shown in FIG. 1, L is $L_{gc}$ shown in FIG. 1, and Lf and Cf are the same as those shown in FIG. 1. The change percentage marked in the upper right corner are the maximum allowable change ranges comparing to nominal values of the devices of the gradient coil. Since the compensation delay is controlled within one or two calculation cycles, the present disclosure meets the specification of the gradient power amplifier output current with a simpler structure.

The processes and logic flows described in the present disclosure can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

For simplicity and illustrative purposes, the present disclosure is described by referring mainly to examples thereof. In the above descriptions, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Therefore, without departing from the scope of the technical scheme of the present disclosure, based on technical essences of the present disclosure, any simple alterations, equal changes and modifications should fall within the protection scope of the technical scheme of the present disclosure. Accordingly, other embodiments are within the scope of the following claims.

The invention claimed is:

1. A state space controller, comprising:
an integral part configured to integrate a control deviation, wherein the control deviation indicates a difference between a digital value of a gradient coil current and a reference current, and the gradient coil current is output from a gradient power amplifier to a gradient coil in a magnetic resonance imaging system; and
a delay compensator configured to generate a digital control amount according to the integrated control deviation by the integral part, and generate a pulse-width modulation drive signal according to the digital control amount, wherein the pulse-width modulation drive signal is input into a power stack of the gradient power amplifier;
wherein the delay compensator comprises:
a subtractor of which a non-inverting input terminal is connected to an output terminal of the integral part;
a delayer configured to delay the digital control amount by one calculation cycle; and
only two feedback loops with calculation cycles, comprising:
a first feedback loop configured to delay the digital control amount by one calculation cycle to obtain a first delayed digital control amount and multiply the first delayed digital control amount with a first compensation coefficient to obtain a first compensation amount, wherein the first compensation amount is input into a first inverting input terminal of the subtractor; and
a second feedback loop configured to delay the digital control amount by two calculation cycles to obtain a second delayed digital control amount and multiply the second delayed digital control amount with a second compensation coefficient to obtain a second compensation amount, wherein the second compensation amount is input into a second inverting input terminal of the subtractor.

2. The state space controller of claim 1, further comprising:
a third feedback loop configured to generate a third compensation amount according to the digital value of the gradient coil current, wherein the third compensation amount is input into a third inverting input terminal of the subtractor.

3. The state space controller of claim 2, wherein the third feedback loop comprises:
a multiplier configured to multiply the digital value of the gradient coil current by a third compensation coefficient to obtain the third compensation amount, wherein the digital value of the gradient coil current is acquired by sampling the gradient coil current and performing an analog-to-digital conversion to the sampled gradient coil current.

4. A control method of a state space controller, the state space controller comprising an integral part and a delay compensator, and the delay compensator comprising a subtractor, a delayer, and only two feedback loops with calculation cycles, the method comprising:

determining, by the state space controller, a control deviation according to a difference between a digital value of a gradient coil current and a reference current, and the gradient coil current is output from a gradient power amplifier to a gradient coil in a magnetic resonance imaging system;

integrating, by the integral part, the control deviation;

generating, by the delay compensator, a digital control amount according to the integrated control deviation, and generating, by the delay compensator, a pulse-width modulation drive signal according to the digital control amount, wherein the pulse-width modulation drive signal is input into a power stack of the gradient power amplifier;

delaying, by a first feedback loop of the only two feedback loops with calculation cycles, the digital control amount by one calculation cycle to obtain a first delayed digital control amount and multiplying, by the first feedback loop, the first delayed digital control amount with a first compensation coefficient to obtain a first compensation amount;

obtaining, by the subtractor, the digital control amount by subtracting the first compensation amount from the integrated control deviation; and delaying, by the delayer, the digital control amount by one calculation cycle to generate the pulse-width modulation drive signal; wherein generating the digital control amount further comprises delaying, by a second feedback loop of the only two feedback loops with calculation cycles, the digital control amount by two calculation cycles to obtain a second delayed digital control amount and multiplying, by the second feedback loop, the second delayed digital control amount with a second compensation coefficient to obtain a second compensation amount; and subtracting, by the subtractor, the second compensation amount from the digital control amount.

5. The control method of claim 4, wherein the state space controller further comprises a third feedback loop, and generating the digital control amount comprises:

generating, by the third feedback loop, a third compensation amount according to the gradient coil current; and subtracting, by the subtractor, the third compensation amount from the digital control amount.

6. The control method of claim 5, wherein generating, by the third feedback loop, the third compensation amount comprises:

multiplying, by the third feedback loop, the digital value of the gradient coil current by a third compensation coefficient to obtain the third compensation amount, wherein the digital value of the gradient coil current is acquired by sampling the gradient coil current and preforming an analog-to-digital conversion of the sampled gradient coil current.

7. A gradient power amplifier, comprising:

a power stack configured to generate a gradient coil current according to a pulse-width modulation drive signal;

a data acquisition section configured to sample and digitalize the gradient coil current generated by the power stack, and output a digital value of the gradient coil current to a state space controller; and the state space controller configured to generate a digital control amount according to the digital value of the gradient coil current and a reference current, and generate the pulse-width modulation drive signal, wherein the pulse-width modulation drive signal is input into the power stack according to the digital control amount, wherein the state space controller comprises:

an integral part configured to integrate a control deviation, wherein the control deviation indicates a difference between the digital value of the gradient coil current and the reference current; and a delay compensator configured to generate the digital control amount according to the integrated control deviation by the integral part and to generate the pulse-width modulation drive signal according to the digital control amount, the delay compensator comprising:

a subtractor of which a non-inverting input terminal is connected to an output terminal of the integral part;

a delayer configured to delay the digital control amount by one calculation cycle; and only two feedback loops with calculation cycles, comprising:

a first feedback loop configured to delay the digital control amount by one calculation cycle to obtain a first delayed digital control amount and multiply the first delayed digital control amount with a first compensation coefficient to obtain a first compensation amount, wherein the first compensation amount is input into a first inverting input terminal of the subtractor; and a second feedback loop configured to delay the digital control amount by two calculation cycles to obtain a second delayed digital control amount and multiply the second delayed digital control amount with a second compensation coefficient to obtain a second compensation amount, wherein the second compensation amount is input into a second inverting input terminal of the subtractor.

* * * * *